(12) United States Patent
Levy

(10) Patent No.: US 9,082,912 B2
(45) Date of Patent: Jul. 14, 2015

(54) PHOTOVOLTAIC MODULE BACKSHEET, MATERIALS FOR USE IN MODULE BACKSHEET, AND PROCESSES FOR MAKING THE SAME

(75) Inventor: Stanley Burton Levy, Wilmington, DE (US)

(73) Assignee: BioSolar, Inc., San Clara, CA (US)

( * ) Notice: Subject to any disclaimer, the term of this patent is extended or adjusted under 35 U.S.C. 154(b) by 288 days.

(21) Appl. No.: 13/093,549

(22) Filed: Apr. 25, 2011

(65) Prior Publication Data

US 2011/0259406 A1    Oct. 27, 2011

Related U.S. Application Data

(60) Provisional application No. 61/327,862, filed on Apr. 26, 2010.

(51) Int. Cl.
- *H01L 31/042* (2014.01)
- *H01L 31/048* (2014.01)
- *B32B 17/10* (2006.01)
- *C08L 77/02* (2006.01)
- *C08L 77/06* (2006.01)

(52) U.S. Cl.
CPC ........ *H01L 31/048* (2013.01); *B32B 17/10018* (2013.01); *C08L 77/02* (2013.01); *C08L 77/06* (2013.01); *B32B 2377/00* (2013.01); *Y02E 10/50* (2013.01)

(58) Field of Classification Search
CPC .................................................. H01L 31/0478
USPC ...................................................... 136/251, 244
See application file for complete search history.

(56) References Cited

U.S. PATENT DOCUMENTS

| | | | | |
|---|---|---|---|---|
| 5,660,645 A | * | 8/1997 | Mori et al. | 136/251 |
| 2003/0194573 A1 | * | 10/2003 | Itoh et al. | 428/461 |
| 2004/0035460 A1 | * | 2/2004 | Gonsiorawski | 136/251 |
| 2007/0251572 A1 | * | 11/2007 | Hoya et al. | 136/256 |
| 2008/0053512 A1 | * | 3/2008 | Kawashima | 136/244 |
| 2009/0101204 A1 | * | 4/2009 | Levy et al. | 136/256 |

OTHER PUBLICATIONS

"Rilsan PA11: Created form a renewable source", Oct. 30, 2007.*
"Product Dara Sheet Vertal 503", Apr. 2007.*
archive.org.*
"Bio-based backsheet".*
Rilsan, "Rilsan PA 11-Key properties".*
Lee, David, et al., "Plastic Materials from Bio-based Nylon 11 and Filled (Mica and Talc) Nylon 11," Polymeric Materials: Science & Engineering (2011), No. 104, pp. 26-27.

* cited by examiner

*Primary Examiner* — Jeffrey T Barton
*Assistant Examiner* — Uyen Tran
(74) *Attorney, Agent, or Firm* — Finnegan, Henderson, Farabow, Garrett & Dunner, LLP

(57) ABSTRACT

Improved photovoltaic module backsheets, and processes for making the same, are disclosed, including nylon resin films filled with mineral additives, for use in photovoltaic laminated modules. The present disclosure provides nylon-11 and/or nylon-1010 films and mineral additives for use as backsheet materials in photovoltaic modules having improved thermal and humidity performance.

4 Claims, 2 Drawing Sheets

Figure 1:
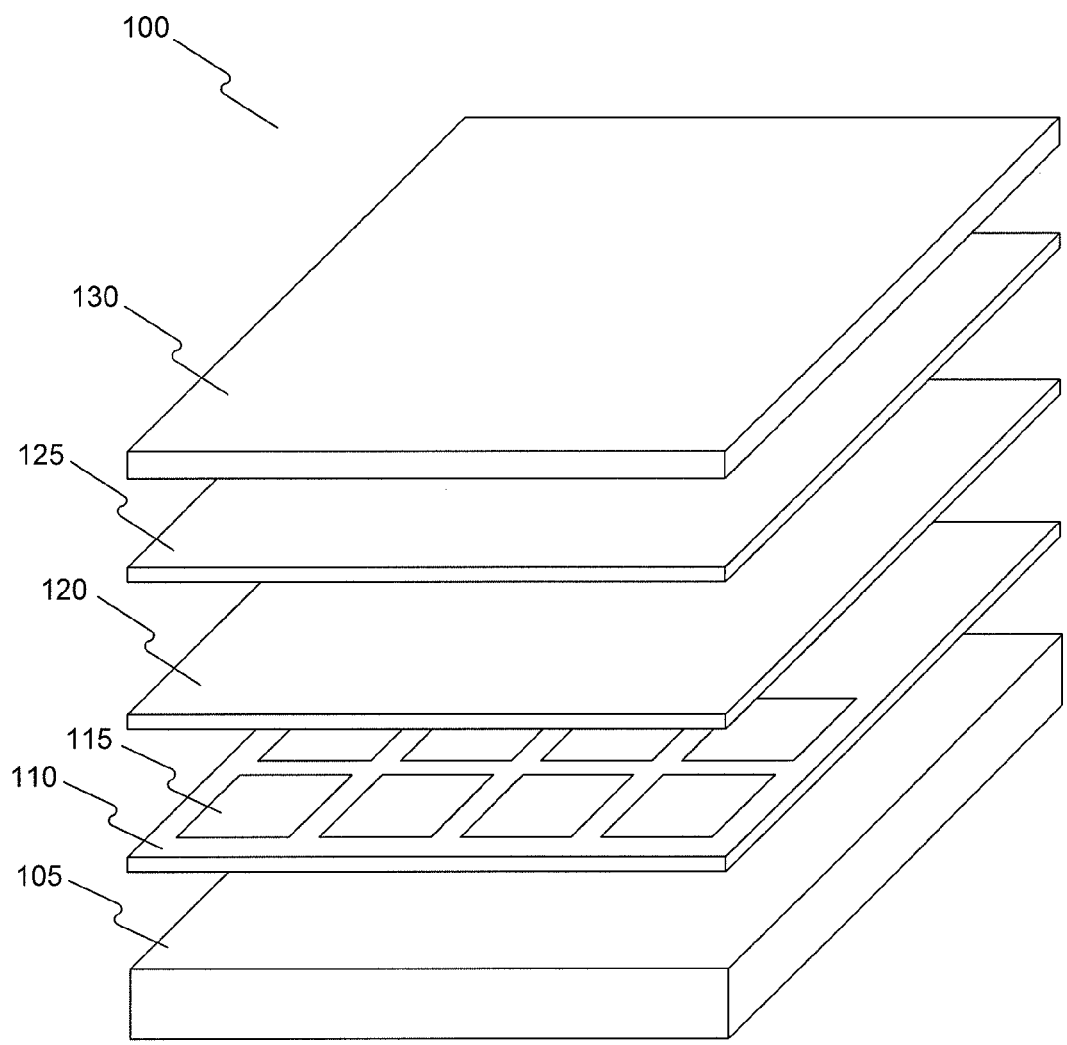

PHOTOVOLTAIC MODULE BACKSHEET, MATERIALS FOR USE IN MODULE BACKSHEET, AND PROCESSES FOR MAKING THE SAME

This application claims the benefit of U.S. Provisional Patent Application No. 61/327,862, filed Apr. 26, 2010, which is herein incorporated by reference.

This disclosure relates generally to the field of photovoltaics, particularly to the use of metal and polymer films therein, and more specifically to an improved photovoltaic module backsheet, and processes for making the photovoltaic module backsheet.

Photovoltaic ("PV") modules are large-area optoelectronic devices that convert solar radiation directly into electrical energy. PV modules are made by interconnecting individually formed and separate solar cells, e.g., multi-crystalline or mono-crystalline silicon solar cells, and then mechanically supporting and protecting the solar cells against environmental degradation by integrating the cells into a laminated PV module. The laminated modules generally comprise a rigid and transparent protective front panel or sheet, and a rear panel or sheet which is typically called a backsheet. Forming a sandwiched arrangement between the front panel and backsheet are the interconnected solar cells and an encapsulant which is transparent to solar radiation. The front panel and backsheet encapsulate the solar cell(s) and provide protection from environmental damage. Alternatively, a thin film material may be deposited on a rigid transparent layer, such as glass, and bonded to a backsheet with a transparent adhesive.

A known backsheet, for example, comprises a laminated structure of polyvinyl fluoride/polyester/ethylene vinyl acetate. Such a laminated structure, however, is not fully impervious to moisture, and as a consequence over time the power output and/or the useful life of PV modules made with this kind of backsheet material is reduced, e.g., due to electrical shorting resulting from absorbed moisture, delamination of the bonded layers, or breakdown of the polyester due to hydrolysis. Thus, the basic design and assembly process of PV modules can exhibit certain drawbacks.

A goal of the PV industry, however, is to have PV modules with an effective working life of decades. Thus, the materials used in constructing PV modules are selected with concern for providing adequate resistance to damage from impact and physical and thermal shock, maximizing the amount of usable solar radiation received by the cells, avoiding short-circuiting and electrical leakage, and minimizing degradation from such environmental factors as moisture, temperature, and ultraviolet sunlight-induced chemical reactions. A further concern of the PV industry is that the useful life goal of PV modules be attained at a commercially acceptable cost.

In addition to the PV industry goal of achieving PV modules with a long useful life at a commercially acceptable cost, the PV industry also seeks to compete with other forms of energy production, such as energy produced from petroleum and other fossil fuels. Thus, another primary goal of the PV industry is to generate "clean" electricity at a cost comparable or less than that of the petroleum industry, in addition to reducing reliance on the world's petroleum supply. However, the PV backsheets used in PV modules, such as those described above, are typically produced from petroleum-based chemicals, which, to a certain extent, defeats one of the goals of using solar energy.

There is an unmet need for non-petroleum-based chemicals for use in PV modules. Resins from renewable sources have been developed over the past several years as substitutes for conventional resins due to the dwindling supply of petroleum feedstocks, its increasing costs, and concerns about the environment. Some resins, for example, polylactic acid (PLA) resins, which are produced from corn or other renewable feedstock, have been considered by the present inventor and others for use in PV backsheets. In addition, the present inventor has considered recyclable mineral materials for use in PV backsheets. Recyclable materials, and resins which may be produced from renewable or sustainable resources, however, have not been previously considered for use in PV backsheets—either because of relatively poor material properties or processing challenges.

For example, films extruded from PLA resins are brittle and do not typically have suitable material properties for use in PV backsheets. Extruded PLA resin brittleness has been at least partially overcome by the use of a biaxial orientation process following film extrusion from PLA resins. Improvements in PLA resin extrusion have been disclosed, for example, in U.S. Pat. No. 5,443,780. The biaxial orientation process, however, is complicated and capital intensive. Furthermore, film breaks frequently can occur in the second (transverse) direction stretch, and gauge uniformity can be difficult to control. The standard uniaxial (machine direction) process is much simpler and less capital intensive, but it does not solve the brittleness problem. In addition, films made using this process tend to have a very low tear strength in the machine direction.

In addition to improving material properties of films extruded from resins, such as improved ductility, impact resistance, and thermal performance, materials for use in PV backsheets will need to maintain their operating performance in real world conditions, including, for example, during continuous use as backsheets on PV modules operating in a multitude of climate conditions.

Therefore, consideration was given to materials made from renewable, recyclable, or sustainable resources, and combinations of those materials, for applicability in the preparation and processing of packaging, such as backsheets, for PV modules. In particular, there is a need to provide a useful laminate film, for use as a PV module backsheet, from a renewable, recyclable, or sustainable source.

In accordance with the systems and methods described herein, there is provided a method of manufacturing a photovoltaic module, comprising: forming a photovoltaic backsheet from a nylon resin material by filling the nylon resin material with about 5% to about 40% by weight of at least one mineral additive; and laminating the photovoltaic backsheet to at least one element chosen from a photovoltaic cell, an encapsulant, and a front panel.

In accordance with the systems and methods described herein, there is also provided a photovoltaic module, comprising: a photovoltaic backsheet comprising a nylon resin material comprising about 5% to about 40% by weight of at least one mineral additive; and at least one element chosen from a photovoltaic cell, an encapsulant, and a front panel.

In accordance with the systems and methods described herein, there is also provided a method of manufacturing a photovoltaic module, comprising: forming a photovoltaic backsheet from a filled nylon resin material by filling at least one material of RILSAN® PA11 grade BESNO-TL nylon-11 or GRILAMID® XE 4019 nylon-1010 with about 5% to about 40% by weight of at least one mineral additive comprising VERTAL® 503, and optionally filling the at least one material with about 2% to about 5% by weight of an additional additive comprising titanium dioxide ($TiO_2$), the photovoltaic backsheet having a thickness of about 1 mil to about 14 mils; and laminating the photovoltaic backsheet to at least one element chosen from a photovoltaic cell, an encapsulant, and a front panel.

In accordance with the systems and methods described herein, there is also provided a photovoltaic module, comprising: a photovoltaic backsheet comprising at least one material of RILSAN® PA11 grade BESNO-TL nylon-11 or GRILAMID® XE 4019 nylon 1010 comprising about 5% to about 40% by weight of at least one mineral additive comprising VERTAL® 503, and optionally comprising about 2% to about 5% by weight of an additional additive comprising titanium dioxide (TiO2), the photovoltaic backsheet having a thickness ranging from about 1 mil to about 14 mils; and a laminate comprising the photovoltaic backsheet and at least one element chosen from a photovoltaic cell, an encapsulant, and a front panel.

Additional features and advantages of the invention will be set forth in part in the description that follows, being apparent from the description or learned by practice of embodiments of the invention. It is to be understood that both the foregoing general description and the following detailed description are exemplary and explanatory, and are intended to provide further explanation of the invention as claimed.

Figure 2:
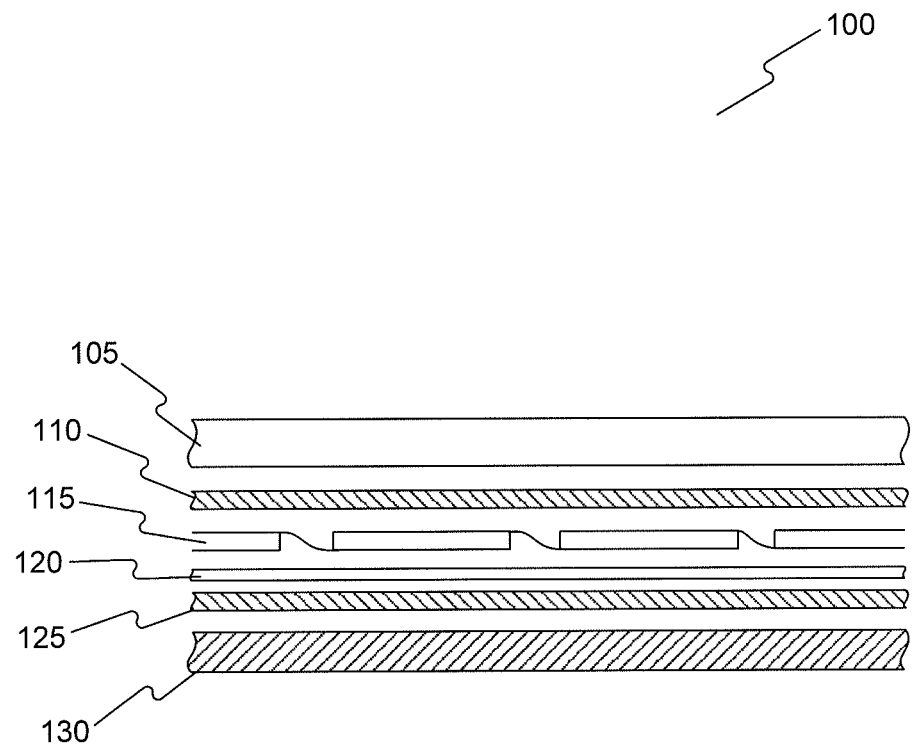

The accompanying drawings, which are incorporated in and constitute a part of this specification, illustrate embodiments of the invention and, together with the description, serve to explain the features, advantages, and principles of the invention. For illustration purposes, none of the following drawings are to scale. In the drawings:

FIG. 1 illustrates a perspective view of a PV module consistent with an embodiment of the disclosure; and FIG. 2 illustrates a cross-sectional view of a PV module consistent with an embodiment of the disclosure.

Reference will now be made in detail to embodiments of the disclosure, examples of which are illustrated in the accompanying drawings. Wherever possible, the same or similar reference numbers will be used throughout the drawings to refer to the same or like parts.

As shown in FIGS. 1 and 2, a laminated PV module 100 may be assembled in a sandwiched structure comprising a transparent front panel 105, (e.g., a front panel made of glass or a transparent polymer), a front layer of at least one sheet of encapsulant 110, an array of solar cells 115 interconnected by electrical conductors, a sheet of scrim 120 to facilitate gas removal during the lamination process, a back layer of at least one sheet of encapsulant 125, and a backsheet 130, followed by bonding these components together under heat and pressure using, e.g., a vacuum-type laminator. PV modules have been formed using a backsheet comprising a thermoplastic polymer (e.g., a resin), glass, or some other material.

The present disclosure provides for the production of photovoltaic backsheets, including photovoltaic backsheets made from a renewable, recyclable, and/or sustainable source, such as a backsheet made from a nylon resin and including a mineral filler. The present disclosure also provides systems and methods to improve the performance of these photovoltaic backsheets under heat and humidity environmental extremes, such as those presented during stringent UL testing, including, for example, the damp heat test and the humidity freeze test as outlined in UL 1703. Moreover, the present disclosure provides for photovoltaic backsheets suitable for packaging PV modules. For example, such backsheets include films made from resins of nylon-11, nylon-1010, or a combination thereof, for backsheets and front glazings of PV modules, backsheets and front glazings for thin film PV modules, and backsheets suitable for application of active PV materials by vacuum deposition, printing, or other means.

In embodiments consistent with the disclosure, materials from sustainable resources have been targeted and developed for use as backsheets in PV modules: a type of nylon made from castor beans. These materials can be filled with various mineral additives to lower the water vapor transmission rate ("WVTR"). WVTR is the steady state rate at which water vapor permeates through a film or thin sheet under specified conditions of temperature and relative humidity. While conditions may vary, ExxonMobil has standardized to 100° F. (37.8° C.) and 90% relative humidity. These are the conditions employed in the experimental results presented in this disclosure. It is desirable to have low WVTR values, since this indicates a good barrier to water moisture consistent with maintaining a moisture barrier and curtailing corrosion.

A PV backsheet consistent with an embodiment may be made from nylon-11, sold under the name RILSAN® PA11 grade BESNO-TL, nylon-1010, sold under the name GRILAMID® XE 4019, or any other suitable polyamide-1010.

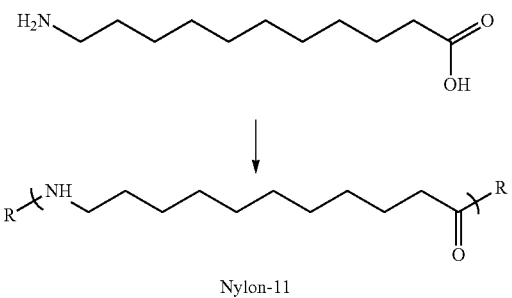

Nylon-11

Nylon-11, such as, for example, RILSAN® PA11 grade BESNO-TL provides a cost effective PV backsheet material with desirable material properties. As used herein, the term "nylon-11" will be used to refer generically to nylon-11 as well as RILSAN® PA11 grade BESNO-TL. Nylon-11 film thicknesses for PV backsheet films may range from about 1 mil to about 14 mils. In certain embodiments, film thickness may range from about 5 mils to about 8 mils.

Nylon-11 is available from several companies including commercial quantities from Arkema, the parent company of AtoFina. Nylon-11 is sold under several product names, including the herein-referenced RILSAN®. Nylon-11 is sold as a bio-based engineering plastic. Nylon-11 is synthesized from the self-condensation of undecylenic acid that is produced from vegetable oils particularly from the caster plant. Nylon-11 has a continuous use temperature rating of about 125° C.

Nylon-11 is extremely slowly biodegradable due to the presence of the polar amide linkage present in all nylons. This linkage is subject to long term hydrolysis from contact with aqueous solutions. Further, it is easily recyclable so it also possesses green properties as a readily recyclable and long-term biodegradable material.

Nylon-11, which may be produced from castor beans, is bio-sustainable, but not biodegradable in the normal sense. However, like most thermoplastics, they are recyclable. Thus, nylon-11 is the only known polyamide resins that can be manufactured from a sustainable resource (e.g., castor oil) and do not require petroleum in their production. Nylon-11 has improved moisture properties over the more common nylons, and has a relative temperature index ("RTI") value of about 105° C. Both the moisture absorption and the WVTR are about five times lower than those properties of the more common nylon-6. The reason for this can be found in the relative structure of nylon-11 and nylon-6. The backbone of nylon-11 consists of eleven methylene (hydrophobic) carbon chains and one carbonyl (hydrophilic) carbon chain. The backbone of nylon-6 consists of five methylene carbon chains and one carbonyl carbon chains. The ratio of hydrophobic carbon chains to hydrophilic carbon chains for nylon-11 is about double that for nylon-6. In addition, nylon-11 has a continuous duty temperature rating of about 125° C.

Nylon-1010

Nylon-1010, such as, for example, GRILAMID® XE 4019 also provides a cost effective PV backsheet material with desirable material properties. Nylon-1010 film thicknesses for PV backsheet films may range from about 1 mil to about 14 mils. In certain embodiments, film thickness may range from about 5 mils to about 8 mils.

Nylon-1010 is currently manufactured by EMS-CHEMIE AG, headquartered in Switzerland, and its product is marketed under the trademark GRILAMID® XE 4019. As used herein, the term "nylon-1010" will be used to refer generically to polyamide-1010 as well as GRILAMID® XE 4019. GRILAMID® XE 4019 is suitable, for example, in applications such as consumer goods, semi-fabricates, tubes (film and sheet), and cable sheathing and protection. GRILAMID® XE 4019 has the same melt viscosity as commercially available nylon-11 product RILSAN® $PA_{11}$ grade BESNO-TL.

Consistent with an embodiment, GRILAMID© XE 4019 may also be used in a PV backsheet. Other grades of GRILAMID® XE 4019 may also be used, for example, being modified with additives to improve thermal, mechanical, and/or UV performance. The present inventor has discovered that nylon-1010, such as GRILAMID® XE 4019, can be used to make PV backsheets. The present inventor has worked with EMS-CHEMIE AG to develop an improved resin grade of GRILAMID® XE 4019 for use in PV backsheets. The improved resin grade of GRILAMID® XE 4019 comprises an additive package which includes both a UV- and thermal-stabilizer.

The starting form of nylon-11 or nylon-1010, before processing into a PV backsheet, may have a substantially pellet shape. As used herein, the term "substantially pellet shape" refers to a shape of the nylon-11 or nylon-1010 starting material, such that the shape is similar in proportions to a sphere or an egg, that is, having three dimensions roughly proportionate to each other. For example, the nylon-11 or nylon-1010 starting material of substantially pellet shape may comprise irregular spheroid particles, regular spheroid particles, or egg-shaped particles, having dimensions in x-, y-, and z-directions within approximately a factor of two of each other, when viewed in a three dimensional Cartesian coordinate system.

Also consistent with an embodiment, mineral additives may be added to either nylon-11 or nylon-1010 to reduce its WVTR. For example, the use of mineral additives may allow for a thinner nylon-11 or nylon-1010 film to be used and have the same or lower WVTR than a nylon-11 or nylon-1010 film without mineral additives. Thus, a thinner nylon-11 or nylon-1010 film containing mineral additives, as compared to a nylon-11 or nylon-1010 film without such additives, would be more cost effective. The mineral additives may constitute a "filler" material in the nylon-11 or nylon-1010 film, with the filler material constituting particles each have a substantially platelet shape. As used herein, the term "substantially platelet shape" refers to a shape of the mineral additives, such that the shape is similar in proportions to a plate or a disk, that is, having two dimensions substantially larger than a third dimension. For example, the mineral additives of substantially platelet form may comprise irregular-shaped flat disks, having dimensions in an x- and y-direction at least several times larger than a dimension in the z-direction, when viewed in a three dimensional Cartesian coordinate system.

Consistent with an embodiment, VERTAL® 503 may be used as the mineral additive in a PV backsheet. However, other grades of platelet talc may also be used, for example, to improve thermal, mechanical, and/or UV performance. The present inventor has discovered that nylon-11 or nylon-1010 can be used to make a PV backsheet with a mineral additive filler material such as VERTAL® 503. VERTAL® 503 is a highly lamellar talc/carbonate mineral pigment currently manufactured by Luzenac America, Inc.

Consistent with an embodiment, mica may be used as the mineral additive in a PV backsheet. Platelet mica may be obtained from Rio Tinto, and may also be used, for example, to improve thermal, mechanical, and/or UV performance. The present inventor has discovered that nylon-11 or nylon-1010 can be used to make a PV backsheet with a mineral additive filler material such as mica.

Thus, as the nylon-11 or nylon-1010 film containing the mineral additives is processed according to methods described in this disclosure, such as moving the film through an extrusion die, the substantially platelet shaped mineral additives would align themselves in the plane of the nylon-11 or nylon-1010 film, and thus provide an additional moisture barrier parallel to a surface of the nylon-11 or nylon-1010 film and perpendicular to the direction in which water vapor would attempt to penetrate.

Consistent with an embodiment, such mineral additives may be talc, mica, quartz, glass, glass flakes, clay, calcium silicate, calcium carbonate, alumina trihydrate, VERTAL® 503, and combinations thereof. One of ordinary skill in the art would recognize that other types of additives may be used without departing from the scope and spirit of this disclosure. Moreover, and consistent with this disclosure, these additives are recyclable and do not deplete the world's petroleum supply. Finally, typical loading ranges for the mineral additives may range from about 5% to about 40% by weight, though one of ordinary skill in the art would recognize that higher or lower loading ranges may be used without departing from the scope and spirit of this disclosure. As used herein, the term "by weight," when used in the context of loading ranges, refers to a total weight of the nylon-11 film or the nylon-1010 film plus the weight of the additive material. The use of mineral additives in nylon-11 or nylon-1010 based backsheets may reduce costs due to the lower amount of nylon resin material needed for the backsheets.

Also consistent with an embodiment, an additional mineral additive may be added to either nylon-11 or nylon-1010 to reduce its WVTR. For example, the additional mineral additive may be titanium dioxide ($TiO_2$), and have a loading range of about 2% to about 5% by weight.

Consistent with an embodiment, films of nylon-11 or nylon-1010 containing one or more of the above-disclosed mineral additives may be produced, for example, according to any of the disclosed methods herein, including but not limited to a single step process using a twin screw mixing extruder followed by a melt pump and an extrusion die. This process is more economical than the standard two step pelletize and film extrude, and may lower the heat history of the nylon-11 or nylon-1010.

For example, a PV backsheet may be formed from a nylon resin material comprising nylon-11, nylon-1010, or a combination thereof, by filling the nylon resin material with about 5% to about 40% by weight of VERTAL® 503. A PV module may subsequently be formed by laminating the PV backsheet to at least one element chosen from a photovoltaic cell, an encapsulant, and a front panel. Consistent with an embodiment, the nylon resin material may be formed by a single-step extrusion process, comprising compounding the nylon resin material with about 5% to about 40% by weight of VERTAL® 503, melting the compounded nylon resin material, extruding the compounded nylon resin material into a film, cooling the film on a casting drum or a three-roll casting device, and winding the film onto a suitable core. Also consistent with an embodiment, the nylon resin material may be formed by a two-step extrusion process, comprising (1) using a twin screw extruder to compound the nylon resin material with about 5% to about 40% by weight of VERTAL® 503, melt the compounded nylon resin material, and extrude the compounded nylon resin material; and (2) conveying the extruded compound to a strand die for cooling and cutting of the cooled nylon resin material into pellets, feeding the pellets into a single screw extruder, extruding the pellets into a film using the single screw extruder, cooling the film on a casting drum or a three-roll casting device, and winding the film onto a suitable core. Also, for example, in either the single-step or the two-step extrusion processes, the compounding step may further include compounding the nylon resin material with about 2% to about 5% by weight of an additional additive of titanium dioxide ($TiO_2$). Consistent with an embodiment, the above-described PV backsheet may have a thickness ranging from about 1 mil to about 14 mils. In certain embodiments, film thickness may range from about 5 mils to about 8 mils.

For example, a PV backsheet may be formed from a filled nylon resin material by filling at least one material of RILSAN® PA11 grade BESNO-TL nylon-11 or GRILAMID® XE 4019 nylon-1010 with about 5% to about 40% by weight of at least one mineral additive comprising VERTAL® 503, and optionally filling the at least one material with about 2% to about 5% by weight of an additional additive comprising titanium dioxide ($TiO_2$), the photovoltaic backsheet having a thickness ranging from about 1 mil to about 14 mils. A PV module may subsequently be formed by laminating the PV backsheet to at least one element chosen from a photovoltaic cell, an encapsulant, and a front panel.

Consistent with the embodiments disclosed herein, PV backsheets made from nylon-11 or nylon-1010 according to this disclosure will have a continuous duty temperature rating of at least about 125° C. and an RTI of about 105° C. or greater, and a dielectric strength of about 2,000 volts/mil to about 3,300 volts/mil, and a Young's Modulus (ksi) of about 200 to about 325. In certain embodiments, PV backsheets made from nylon-11 or nylon-1010 according to this disclosure will have a dielectric strength of greater than about 2,000 volts/mil.

Initial experiments on extruded nylon-11 film, for example, were performed with varying weight percentages of additives, including about 0%, about 5%, about 10%, about 20%, and about 40%, for a mica additive and for a talc additive. Water vapor transmission rate (WVTR) and dielectric strength data for these experiments are provided in the attached tables and charts. For example, the following table (Table 1) illustrates the WVTR results (g/m²/day) for nylon-11 with mica and nylon-11 with talc, for varying percentages of mica or talc additive.

TABLE 1

| % of Additive by Weight | Nylon-11 w/Mica, Nylon | Nylon-11 w/Talc |
|---|---|---|
| 0 | 3.42 | 3.42 |
| 5 | 2.52 | 2.06 |
| 10 | 2.49 | 2.29 |
| 20 | 2.07 | 1.65 |
| 40 | n/a | 1.41 |

Low WVTR values indicate a good barrier to water moisture consistent with maintaining a moisture barrier and maintaining the interior dry. Preferably, a low WVTR is desirable to curtail corrosion. Experimental data for 6 mil thick unfilled- and filled-nylon-11 films are given in Table 2 below, along with typical values for other thin sheet materials including those currently employed as moisture barriers. The values for the non-nylon-11 materials are for 1 mil film. Table 2 summarizes the WVTR data at 100° F. for 24 hours.

TABLE 2

| Material | WVTR g/m² (1 day) |
|---|---|
| Nylon-11 | 3.42 |
| Nylon-11/5% Talc | 2.06 |
| Nylon-11/10% Talc | 2.29 |
| Nylon-11/20% Talc | 1.65 |
| Nylon-11/40% Talc | 1.41 |
| Nylon-11/5% Mica | 2.52 |
| Nylon-11/10% Mica | 2.49 |
| Nylon-11/20% Mica | 2.07 |
| High-density polyethylene | 4.7-4.8 |
| Polypropylene | 9.3-11 |
| Polystyrene (oriented) | 109-155 |
| Nylon-6 (biaxial) | 155-202 |

The filled nylon-11 materials have lower WVTR values in comparison to nylon-11 itself (unfilled) and other conventional materials, suggesting that in fact the platelet mica and talc act as a clad barrier against moisture intrusion. Addition of 40% talc offers a protection of over 100% in moisture resistance.

Dielectric Strength

Dielectric strength and other related measurements were determined for several purposes. Some of the possible uses for modified nylon-11 materials include their association with electronics. Generally efficiency of electrical devices decreases with increase in temperature. Thus, materials with good thermal conductivity should aid in heat dissipation.

Improvements in dielectric strength were observed, as measured by an independent testing laboratory, using ASTM D 149-97A (reapproved in 2004) method A short time test. A voltage rise rate of about 500 VAC, RMS (60 Hz/sec) was employed using transformer oil as the test medium and a ¼ inch diameter stainless steel (type 3) electrode. The samples were pre-conditioned about 40 hours at about 23° C. and about 50% RH. Test conditions were about 71° F. and about 46% RH.

For example, an unfilled nylon-11 film having an approximate thickness of 6 mils had an average dielectric strength of about 2100 volts/mil (measured from about 2000 volts/mil to about 2200 volts/mil); an approximately 6 mil thick 20% platelet mica filled nylon-11 film had a dielectric strength of about 3000 volts/mil (measured from about 2600 volts/mil to about 3300 volts/mil); an approximately 6 mil thick 20% platelet talc filled nylon-11 film had a dielectric strength of about 2600 volts/mil (measured from about 2400 volts/mil to about 2800 volts/mil); and an approximately 6 mil thick 40% platelet talc filled nylon-11 film had a dielectric strength of about 3000 volts/mil (measured from about 2700 volts/mil to about 3300 volts/mil). One of ordinary skill in the art would appreciate that a thicker film will have a higher dielectric strength.

Improvements in dielectric constant were also observed, for example, with nylon-11 with 20% mica or 20% talc additive. For nylon-11 with 20% mica, a dielectric constant of about $\epsilon_r=3.82\pm0.1$ (at about 100 kHz) was measured. For nylon-11 with 20% talc, a dielectric constant of about $\epsilon_r=4.45\pm0.1$ (at about 100 kHz) was measured. For comparison, nylon-11 without additives has an estimated dielectric constant of about $\epsilon_r=3.3$ (at about 100 kHz), with about 3.9 being measured at about 100 Hz and about 3.1 being measured at about 1 MHz.

The following Table 3 summarizes the experimental results for dielectric strength, breakdown voltage, and location of failure for different materials averaged over five test runs.

TABLE 3

| Material | Location of Failure | Breakdown Voltage KVAC, RMS (60 Hz) | Dielectric Strength (volts/mil) |
| --- | --- | --- | --- |
| Nylon-11 | Edge | 15 | 2,100 |
| Nylon-11/Mica 20% | Edge | 16 | 3,000 |
| Nylon-11/Talc 20% | Edge | 15 | 2,600 |
| Nylon-11/Talc 40% | Edge | 14 | 3,000 |

All of the test materials showed good dielectric strength and breakdown voltages. A dielectric strength of about 3,000 volts/mil is relatively high, and would allow for thinner backsheets to be employed. The inventor has discovered that even thin sheets, on the order of 1 mil, possess sufficient dielectric strength for use in as a backsheet. Further, failure was at the edges of the samples, which is consistent with the films being coherent throughout.

Specimen Thickness

In the initial experiments, specimen thickness for additive-free nylon-11 varied from about 0.0065 inches (6.5 mils) to about 0.0077 inches (7.7 mils). For nylon-11 including 20% mica additive, the specimen thickness varied from about 0.0050 inches (5 mils) to about 0.0059 inches (5.9 mils). For nylon-11 including 20% talc additive, the specimen thickness varied from about 0.0053 inches (5.3 mils) to about 0.0062 inches (6.2 mils). For nylon-11 including 40% talc additive, the specimen thickness varied from about 0.0036 inches (3.6 mils) to about 0.0049 inches (4.9 mils).

Nylon-1010 Results

Initial experiments on extruded nylon-1010 film, for example, produced similarly good results. For example, two experiments were conducted on nylon-1010 films of 7.5 mil and 5.5 mil thickness, respectively. WVTR results for the nylon-1010 films, including 40% talc additive, are shown in the following tables, and were about 0.63 g/m$^2$/day for the 7.5 mil nylon-1010 and 1.46 g/m$^2$/day for the 5.5 mil nylon-1010.

Higher Thermal Conductivity

Testing by an independent authority reveals that PV backsheets made from nylon-11 according to this disclosure can actually improve the power output of solar panels by dissipating heat more quickly than conventional backsheets. The efficiency of a PV module is determined by the percentage of the incoming solar radiation that is converted to electricity within the solar panel. The efficiency of conventional silicon-based solar cells decreases dramatically as the temperature of the module increases. According to tests performed in June 2010 by ThermTest, Inc, a leading independent authority in thermo-physical measurements and instrumentation, the measured thermal conductivity of PV backsheets made from nylon-11 according to this disclosure was 70 percent higher than the currently available petroleum-based backsheets. The higher thermal conductivity of the materials used to make the PV backsheets according to this disclosure allows the heat that builds up from solar exposure to be more effectively dissipated into the surrounding air. Thus, the higher thermal conductivity contributes to a lower operating temperature within the PV module, directly leading to higher energy efficiency and improved power output for PV modules incorporating PV backsheets made according to this disclosure.

Thermal conductivity was measured for two test samples, nylon-11 itself, and nylon-11 containing 40% talc at about 25° C. using the TPS thermal conductivity system, ISO 22007-2:2008. The TPS, transient plane source, is an instrument designed to measure the thermal conductivity of solids and liquids in the range of about 0.01 W/mK to about 500 W/mK over the temperature range from about 30K to about 1,000K. The conductivity of nylon-11 itself was about 0.289 W/mK and for the filled nylon-11 was about 0.491 W/mK. (The standard deviation was less than about 0.7%.) As noted above, a high thermal conductivity is advantageous to allow dissipation of heat and provide protection against heat buildup. By comparison, the thermal conductivity of the filled material is almost twice that of many materials employed in the electronics industry.

Higher Surface Energy

Another beneficial characteristic of PV backsheets made from nylon-11 or nylon-1010 according to this disclosure is high surface energy, which lowers the manufacturing cost of PV panels by eliminating the backsheet surface treatment process. Surface energy is a measure of the wettability of a surface. Low energy surfaces do not bond well with adhesives, whereas high surface energy surfaces attract and hold onto adhesives. Most conventional backsheets have low surface energy, thereby requiring special surface treatments to increase their surface energy in order to properly bond with film adhesives and solar cells. This costs time, money, and adds to the risk of premature panel failure. The use of these treatments complicates both the manufacturing process and also inventory management. PV backsheets made according to this disclosure have a naturally high surface energy. Therefore, no surface treatment is needed to produce a strong bond with solar cells. For example, measurements of surface energy for nylon-11 backsheet materials having no surface treatment indicate a surface tension of about 56 dynes/cm. In comparison, surface treated conventional PV outer glazings measure only slightly above 40 dynes/cm. Thus, manufacturers using PV backsheets made according to this disclosure will not have to implement a special surface treatment process, or be concerned with the costs of backsheet surface treatments.

Hydrolytic Stability

PV backsheets made from nylon-11 according to this disclosure were placed in a damp heat oven (85° C. at 85% RH) for over 3000 hours. There was no apparent change in color of the backsheet and no delamination separation of the backsheet from the PV module.

Bond Strength

The peel strength with EVA encapsulant on PV backsheets made from nylon-11 or nylon-1010 according to this disclosure is about 40 N/cm with very little reduction in damp heat performance.

Consistent with embodiments of the disclosure, and depending upon the particular PV module and desired application, modifications may be made to the PV backsheet. In these cases, the PV backsheet material may be extrusion coated, laminated, or vacuum deposited onto other materials. Additionally, the PV backsheet material could be vacuum metalized using non-conductive metal oxides such as aluminum oxide, oxides of silicon, or other minerals to further lower the WVTR.

It will be apparent to those skilled in the art that various modifications and variations can be made in the disclosed systems and methods without departing from the scope or spirit of the invention. For example, to the naked eye, nylon-11 is transparent. At times, opaque nylon-11 may be desired and this may be brought about through mixing about 2% titanium (IV) oxide with or without a talc or mica filler material. For example, a PV backsheet material consistent with embodiments of the disclosure may comprise, by weight, approximately 60% nylon-11, approximately 38% talc, and approximately 2% $TiO_2$.

Other embodiments of the invention will be apparent to those skilled in the art from consideration of the specification and practice of the invention disclosed herein. It is intended that the specification and examples be considered exemplary only.

What is claimed is:

1. A photovoltaic module, comprising:
   a single-layer photovoltaic backsheet comprising at least one material of a nylon-11 comprising about 5% to about 40% by weight of at least one mineral additive comprising a highly lamellar talc or mica mineral pigment, and optionally comprising about 2% to about 5% by weight of an additional additive comprising titanium dioxide (TiO2), the photovoltaic backsheet having a thickness ranging from about 1 mil to about 14 mils; and
   a laminate comprising the photovoltaic backsheet and at least one element chosen from a photovoltaic cell, an encapsulant, and a front panel.

2. The module according to claim 1, wherein the at least one mineral additive comprises substantially platelet-shaped mineral particles.

3. The module according to claim 1, wherein the single layer photovoltaic backsheet further comprises the additional additive of titanium dioxide ($TiO_2$).

4. The module according to claim 1, wherein the at least one material of a nylon-11 includes a non-petroleum-based nylon-11.

* * * * *